(12) United States Patent
Pamulaparthy et al.

(10) Patent No.: US 9,197,066 B2
(45) Date of Patent: Nov. 24, 2015

(54) METHOD, SYSTEM AND DEVICE OF PHASE ENABLE OR DISABLE FUNCTIONALITY IN A METER

(75) Inventors: Balakrishna Pamulaparthy, Andhra Pradesh (IN); George Paul Gerdan, Upper Victoria (AU)

(73) Assignee: General Electric Company, Schenectady, NY (US)

( * ) Notice: Subject to any disclaimer, the term of this patent is extended or adjusted under 35 U.S.C. 154(b) by 1085 days.

(21) Appl. No.: 13/230,007

(22) Filed: Sep. 12, 2011

(65) Prior Publication Data
US 2013/0063280 A1 Mar. 14, 2013

(51) Int. Cl.
*H02J 3/26* (2006.01)
*G01D 4/00* (2006.01)
*G01R 29/16* (2006.01)
*G01R 22/10* (2006.01)

(52) U.S. Cl.
CPC ... *H02J 3/26* (2013.01); *G01D 4/00* (2013.01); *G01R 22/10* (2013.01); *G01R 29/16* (2013.01); *Y02E 40/50* (2013.01)

(58) Field of Classification Search
CPC .......... H02J 3/26; G01R 22/10; G01R 29/16; G01D 4/00; Y02E 40/50
USPC ................... 700/286, 291, 295–298
See application file for complete search history.

(56) References Cited

U.S. PATENT DOCUMENTS

| | | | |
|---|---|---|---|
| 5,744,983 A | 4/1998 | Bazes | |
| 2006/0294224 A1* | 12/2006 | Wilson et al. | 709/224 |
| 2009/0327786 A1* | 12/2009 | Carroll et al. | 713/340 |
| 2010/0292858 A1* | 11/2010 | Iwamura | 700/293 |
| 2012/0316691 A1* | 12/2012 | Boardman et al. | 700/293 |
| 2013/0021163 A1* | 1/2013 | Watford | 340/638 |

* cited by examiner

*Primary Examiner* — Mohammad Ali
*Assistant Examiner* — Nathan L Laughlin
(74) *Attorney, Agent, or Firm* — Sutherland Asbill & Brennan LLP

(57) ABSTRACT

Described herein are embodiments of methods, devices and systems of phase functionality for a meter. One aspect comprises a method of phase functionality for a meter. One embodiment of the method comprises determining a load value for each phase of a poly-phase electrical system; comparing, using a processor, the load value for each phase of a poly-phase electrical system with a respective threshold value for each phase of the poly-phase electrical system; and opening or closing one or more relays based on the comparison, wherein the one or more relays are each associated with respective phase of the poly-phase electrical system.

33 Claims, 7 Drawing Sheets

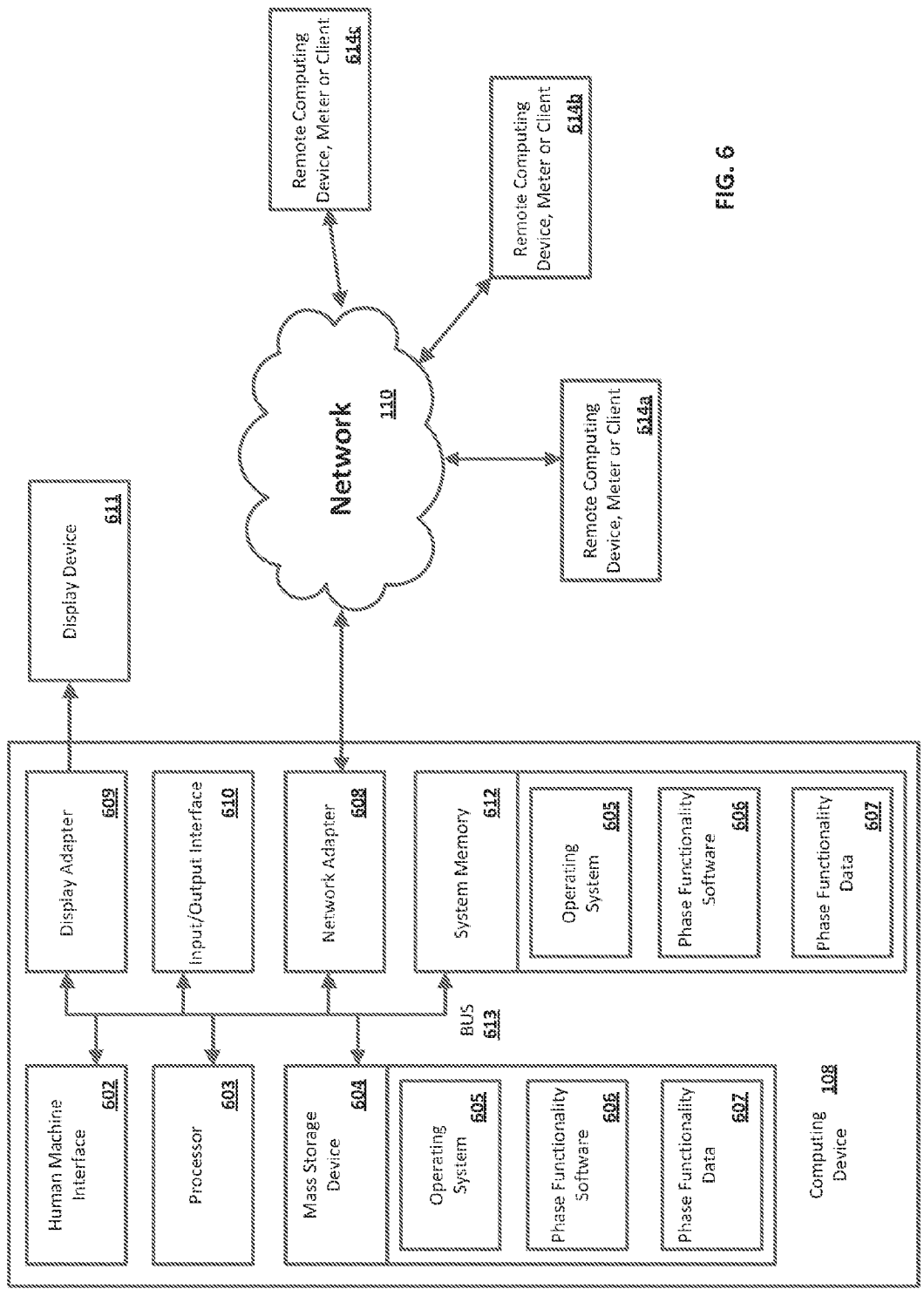

METHOD, SYSTEM AND DEVICE OF PHASE ENABLE OR DISABLE FUNCTIONALITY IN A METER

FIELD OF THE INVENTION

This invention generally relates to utility meters, and in particular, to systems, methods, and apparatus for automatically enabling or disabling phase functionality in a poly-phase electric utility meter.

BACKGROUND OF THE INVENTION

Loading among the phases in a poly-phase electrical system is not always balanced because all loads attached to the poly-phase system are not connected to all of the phases. For example, in a three-phase electrical system serving a multi-story facility, one phase (e.g., A phase) may serve the first floor, while another phase (e.g., B phase) may serve the second floor and a third phase (e.g., C phase) may serve the third floor. Loads on the three floors may not be balanced—some floors may have no loads at all (e.g., the floor is not finished or it has not been leased). In other instances, loads may only be connected to a subset of the number of phases available. For example, in a three phase system, some of the loads may only be connected to two of the three phases rather than all three phases. This can also cause load imbalance.

Imbalanced loads can cause excessive voltage drop on the phase (or phases) that are more heavily loaded due to higher $I^2R$ losses in those phases. Imbalance can also result in higher than normal neutral currents, unexpected heating in electrical power delivery systems and devices and harmonics on the power system. Therefore, it is desired that loads be as balanced as practicable in poly-phase electrical systems.

In some instances, utility providers desire to electronically communicate with the utility service meters serving the loads for numerous purposes including scheduling disconnection or connection of utility services to the metered loads, automatic meter reading (AMR), load shedding and load control, automatic distribution and smart-grid applications, outage reporting, providing additional services such as Internet, video, and audio, etc. In many of these instances, to perform these functions the meters can be configured to communicate with one or more computing devices through a communications network, which can be wired, wireless or a combination of wired and wireless, as known to one of ordinary skill in the art.

In many instances, such meters are also equipped with one or more electromechanical switches that can be actuated either locally by an on-board processor or remotely to perform functions such as disconnection or connection of utility services to the metered loads, load shedding and load control, and the like.

Therefore, systems and methods are desired that can help balance loads on an electrical system including phase enablement or disablement in a smart meter to overcome challenges present in the art, some of which are described above.

BRIEF DESCRIPTION OF THE INVENTION

Described herein are embodiments of systems, methods, and apparatus for automatically enabling or disabling phase functionality in a poly-phase electric utility meter.

One aspect comprises a method of phase functionality for a meter. One embodiment of the method comprises determining a load value for each phase of a poly-phase electrical system; comparing, using a processor, the load value for each phase of a poly-phase electrical system with a respective threshold value for each phase of the poly-phase electrical system; and opening or closing one or more relays based on the comparison, wherein the one or more relays are each associated with a respective phase of the poly-phase electrical system.

Another aspect comprises a meter. One embodiment of the meter is comprised of a memory, wherein a threshold value for each phase of a poly-phase electrical system is stored on the memory; a plurality of relays, wherein each one of the plurality of relays is configured to electrically open or close a respective phase of the poly-phase electrical system; and a processor. The processor is operably connected with the memory and the plurality of relays, and the processor is configured to: determine a load value for each phase of a poly-phase electrical system; compare the load value for each phase of a poly-phase electrical system with a respective threshold value for each phase of the poly-phase electrical system stored in the memory; open one or more of the plurality of relays based on the comparison when the comparison determines that the load value for that phase is less than the respective threshold value for that phase; and provide an alarm signal upon opening the one or more of the plurality of relays when the comparison determines that the load value for that phase is less than the respective threshold value for that phase.

In yet another aspect, a system is described. One embodiment of the system is comprised of a memory, wherein a threshold value for each phase of a poly-phase electrical system is stored on the memory; a plurality of relays, wherein each one of the plurality of relays is configured to electrically open or close a respective phase of the poly-phase electrical system; and a processor. The processor is operably connected with the memory and the plurality of relays, and wherein the processor is configured to: determine a load value for each phase of a poly-phase electrical system; compare the load value for each phase of a poly-phase electrical system with a respective threshold value for each phase of the poly-phase electrical system stored in the memory; and open or close one or more of the plurality of relays based on the comparison.

Additional advantages will be set forth in part in the description which follows or may be learned by practice. The advantages will be realized and attained by means of the elements and combinations particularly pointed out in the appended claims. It is to be understood that both the foregoing general description and the following detailed description are exemplary and explanatory only and are not restrictive, as claimed.

BRIEF DESCRIPTION OF THE DRAWINGS

The accompanying drawings, not necessarily drawn to scale, which are incorporated in and constitute a part of this specification, illustrate embodiments and together with the description, serve to explain the principles of the methods, systems and apparatus described herein:

FIG. 6 is a block diagram illustrating an exemplary operating environment for performing the disclosed methods.

DETAILED DESCRIPTION OF THE INVENTION

Before the present methods and systems are disclosed and described, it is to be understood that the methods and systems are not limited to specific synthetic methods, specific components, or to particular compositions. It is also to be understood that the terminology used herein is for the purpose of describing particular embodiments only and is not intended to be limiting.

As used in the specification and the appended claims, the singular forms "a," "an" and "the" include plural referents unless the context clearly dictates otherwise. Ranges may be expressed herein as from "about" one particular value, and/or to "about" another particular value. When such a range is expressed, another embodiment includes from the one particular value and/or to the other particular value. Similarly, when values are expressed as approximations, by use of the antecedent "about," it will be understood that the particular value forms another embodiment. It will be further understood that the endpoints of each of the ranges are significant both in relation to the other endpoint, and independently of the other endpoint.

"Optional" or "optionally" means that the subsequently described event or circumstance may or may not occur, and that the description includes instances where said event or circumstance occurs and instances where it does not.

Throughout the description and claims of this specification, the word "comprise" and variations of the word, such as "comprising" and "comprises," means "including but not limited to," and is not intended to exclude, for example, other additives, components, integers or steps. "Exemplary" means "an example of" and is not intended to convey an indication of a preferred or ideal embodiment. "Such as" is not used in a restrictive sense, but for explanatory purposes.

Disclosed are components that can be used to perform the disclosed methods and systems. These and other components are disclosed herein, and it is understood that when combinations, subsets, interactions, groups, etc. of these components are disclosed that while specific reference of each various individual and collective combinations and permutation of these may not be explicitly disclosed, each is specifically contemplated and described herein, for all methods and systems. This applies to all aspects of this application including, but not limited to, steps in disclosed methods. Thus, if there are a variety of additional steps that can be performed it is understood that each of these additional steps can be performed with any specific embodiment or combination of embodiments of the disclosed methods.

The present methods and systems may be understood more readily by reference to the following detailed description of preferred embodiments and the examples included therein and to the figures and their previous and following description.

Figure 1A:
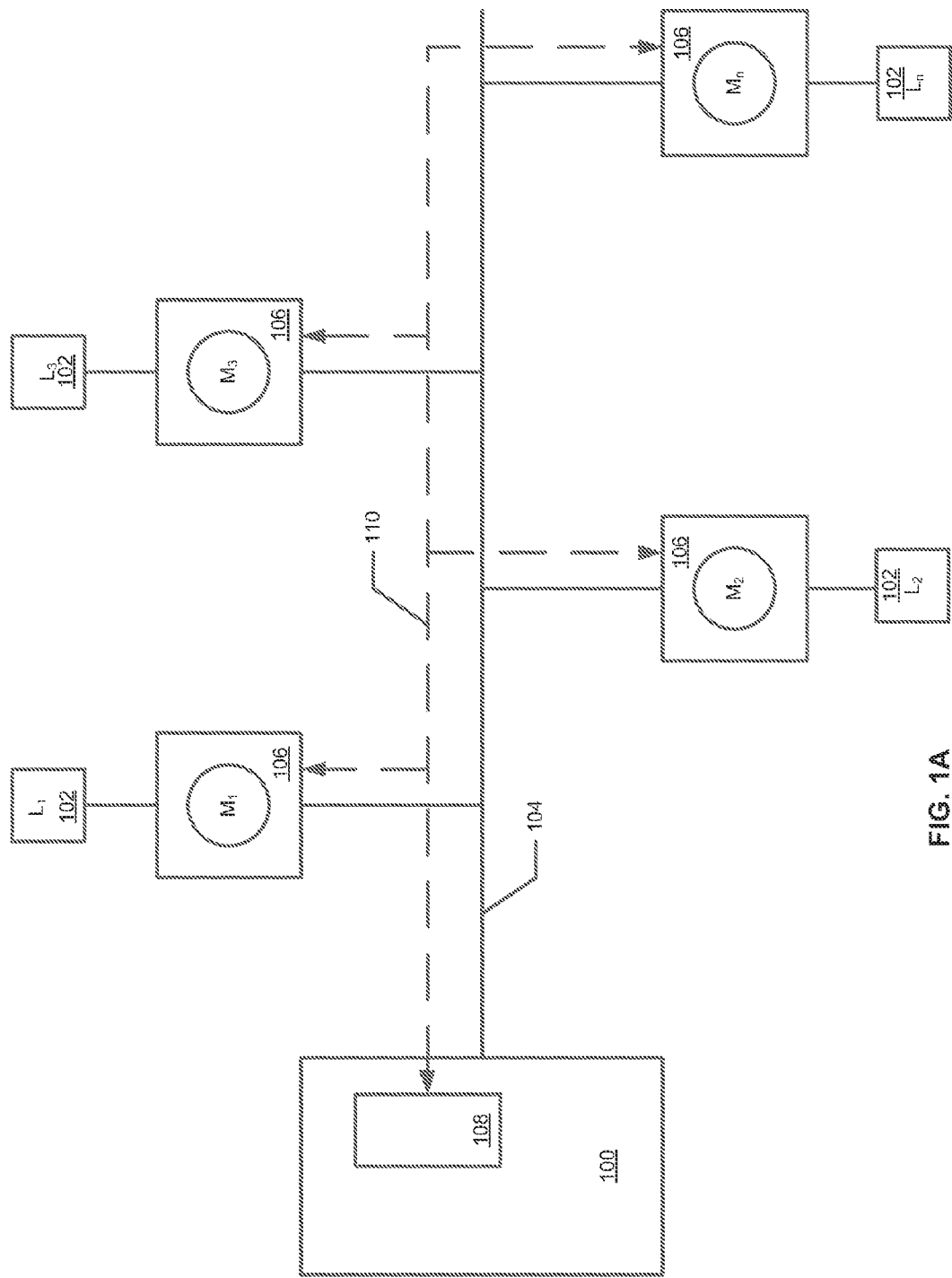
FIG. 1A is a single-line block diagram of a section of an exemplary utility distribution system.

Referring to FIG. 1A, an illustration of one type of system that would benefit from embodiments of the present invention is provided. FIG. 1A is a single-line block diagram of a section of an exemplary utility distribution system such as, for example, an electric distribution system. As shown in FIG. 1A, a utility service is delivered by a utility provider 100 to various loads $L_1$-$L_n$ 102 through a distribution system 104. In one aspect, the utility service provided can be electric power. Though shown in FIG. 1A as a single-line diagram, it is to be appreciated that the distribution system 104 can be comprised of single-phase and/or poly-phase components and be of varying voltage levels. Consumption and demand by the loads 102 can be measured at the load locations by meters $M_1$-$M_n$ 106. If an electric meter, the meters 106 can be single-phase or poly-phase electric meters, as known to one of ordinary skill in the art, depending upon the load 102. For example, the load can be single-phase and therefore the meter 106 can be single phase. Single-phase loads can be connected to different phases (e.g., phase A, phase B or phase C) of the distribution system 104. Similarly, for example, the load 102 can be a poly-phase load such as a three-phase load and the meter 106 can be a three-phase meter that meters the three phases serving the load 102.

In one aspect, the electric meter 106 is a smart meter as described herein and as known to one of ordinary skill in the art. Hereinafter, the specification will refer to the meter 106 as a "meter," "electric meter," and/or "smart meter," where the terms can be used interchangeably. One non-limiting example of a smart meter is the GE 1210+c meter as available from General Electric Company ("GE") (Schenectady, NY). Another non-limiting example of a smart meter is the GE SM3000 meter as also available from GE. While consumption or demand information is used by the utility provider 100 primarily for billing the consumer, it also can be used for other purposes including planning and profiling the utility distribution system. In some instances, utility providers 100 desire to electronically communicate with the meters 106 for numerous purposes including scheduling disconnection or connection of utility services to the loads 102, automatic meter reading (AMR), load shedding and load control, automatic distribution and smart-grid applications, outage reporting, providing additional services such as Internet, video, and audio, etc. In many of these instances, the meters 106 can be configured to communicate with one or more computing devices 108 through a communications network 110, which can be wired, wireless or a combination of wired and wireless, as known to one of ordinary skill in the art. In one aspect, the network 110 is an advanced metering infrastructure (AMI) network. AMI refers to systems that measure, collect and analyze energy usage, and interact with advanced devices such as electricity meters, gas meters, water meters, and the like through various communication media either on request (on-demand) or on pre-defined schedules. This infrastructure includes hardware, software, communications, consumer energy displays and controllers, customer associated systems, meter data management (MDM) software, supplier and network distribution business systems, and the like. The network 110 between the measurement devices (e.g., meters 106) and business systems allows collection and distribution of information to customers, suppliers, utility companies and service providers. This enables these businesses to either participate in, or provide, demand response solutions, products and services. By providing information to customers, the system assists a change in energy usage from their normal consumption patterns, either in response to changes in price or as incentives designed to encourage lower energy usage at times of peak-demand periods or higher wholesale prices or during periods of low operational systems reliability. In one aspect, the network 110 comprises at least a portion of a smart grid network. In one aspect, the network 110 utilizes one or more of a WPAN (e.g., ZigBee, Bluetooth), LAN/WLAN (e.g., 802.11n, microwave, laser, etc.), WMAN (e.g., WiMAX, etc.), WAN/WWAN (e.g., UMTS, GPRS, EDGE, CDMA, GSM, CDPD, Mobitex, HSDPA, HSUPA, 3G, etc.), RS232, USB, Firewire, Ethernet, wireless USB, cellular, OpenHAN, power line carrier (PLC), broadband over power lines (BPL), and the like. Such meters 106 can be equipped with one or more switches that can be used to remotely connect or disconnect the service or product delivered.

Figure 1B:
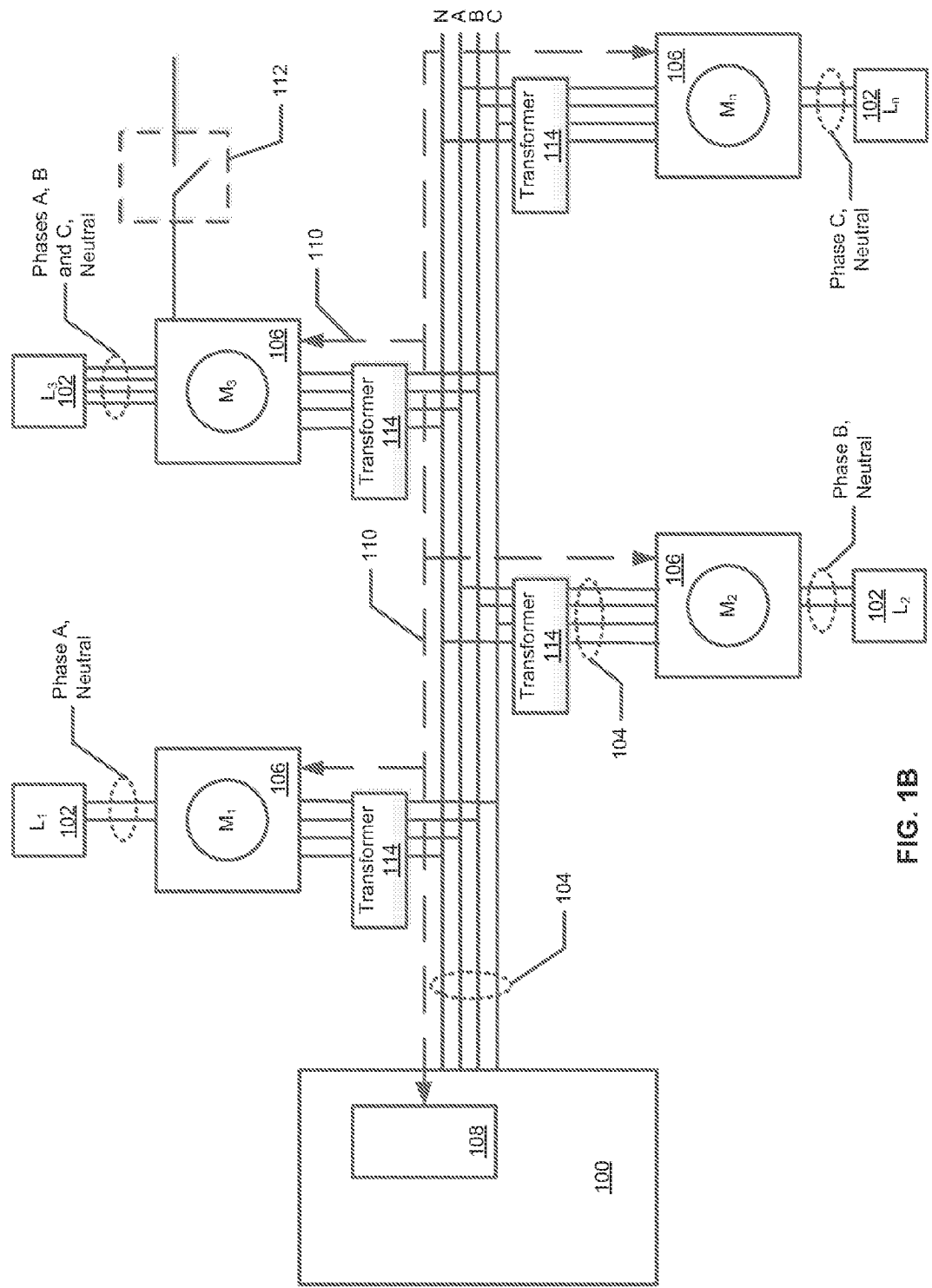
FIG. 1B is an exemplary illustration of a three-phase, four-wire (phases A, B, C and neutral, N) distribution system 104 according to one embodiment of the present invention.

For example, in some instances an electrical distribution system 104 may be a poly-phase system such as a three-phase, four-wire network, which supplies power-using feeders. Each of the feeder lines then branches into multiple circuits to power a plurality of local pole-mounted or pad-mounted transformers, which step the voltage down to final voltages of, for example, 120 or 240 volts per phase for delivery and metering at commercial and residential customer locations. Generally, residential customers can be connected to any one phase of the three-phase system using a single-phase meter and commercial customers can be connected to all the three phases using a three-phase meter with a load control relay ("LCR") connected on any one of the phases. As described herein, utilities desire that loads be balanced as practicable in a poly-phase electrical system. Systems, methods, and apparatus for automatically enabling or disabling phase functionality using a poly-phase electric utility meter, as described herein, can be used by the utility to help balance loads. Such a poly-phase electrical system as described above is illustrated in FIG. 1B. FIG. 1B is an exemplary illustration of a three-phase, four-wire (phases A, B, C and neutral, N) distribution system 104 according to one embodiment of the present invention. As shown in FIG. 1B, distribution system 104 is comprised of three phase conductors (phases A, B and C) and a neutral wire. In one aspect, each of the three phases and the neutral are provided to each meter 106. In one aspect, the voltage provided at the meters 106 is stepped down by a transformer 114 to a level that can be used by the load 102 (e.g. 120/240, 277/480, and the like). The transformer 114 can be two or three single-phase transformers, or a single three-phase transformer. In one aspect, the meter 106 can be configured to enable phases A, B or C to serve the load 102, or to disconnect any one or more of the phases (A, B, or C) from the load 102. In one aspect, the meter 106 can comprise a load control relay (LCR) 112. In one aspect, the meter 106 can be configured to enable phases A, B and C to serve the load connected to the LCR 112, or to disconnect (disable) any of phases A, B, or C from the load connected to the LCR 112. For balancing the load on each phase of the distribution system 104 and performing other utility functions and analyses, it is desired to enable or disable one or more phases of a poly-phase electrical system serving a load 102.

Therefore, it is desired that the meters 106 of a system such as that shown in FIGS. 1A and 1B are configured to have capabilities beyond that of measurement of utility service consumption. Described herein are embodiments of methods, devices and systems for automatically enabling or disabling phase functionality in a poly-phase electric utility meter. In various aspects, phase functionality can be implemented in the meter using advanced communication techniques such as AMI, Optical, RF, WiMax, LAN/WAN, GSM, etc., and meter software (e.g., GE Meter Mate™ software).

In one aspect, the phase functionality can be configured to update automatically. For example, the processor of a smart meter can be configured to determine a load value for each phase of a poly-phase electrical system and compare the load value for each phase of a poly-phase electrical system with a respective threshold value for each phase of the poly-phase electrical system stored in a memory associated with the processor. The meter processor can be configured to automatically open or close one or more of the plurality of relays based on the comparison. For example, if the load on a particular phase (as measured by current or kilowatts) drops below a predetermined threshold value, then the meter processor can be configured to open the relay on that particular phase thereby helping avoid a load imbalance. In another aspect, the results of the comparison can be provided to a separate computing device over a network, such as an AMI network. In such an embodiment, the processor of the meter causes the relay to open upon receiving an open signal from the computing device over a network. The signal from the other computing device can be automatically sent by the other computing device, or it can be the result of an operator initiating the sending of the signal. In various aspects, the remote computing device or the operator may be required to have proper authentication before opening the relays. In one aspect, whether opened automatically or remotely, the processor of the meter can be configured to provide an alarm signal upon opening the respective relay of the phase when the comparison determines that the load value for that phase is less than the respective threshold value for that phase. In one aspect, the alarm signal can be provided over the network to the other computing device. In another aspect, the alarm signal can be provided by the processor to an in-home device such as an in-home display. In yet another aspect, the processor can be configured to transmit an email or text such as a SMS text to a designated address or telephone number in order to provide an alarm notification. In one aspect, a request to transmit an email or text can be transmitted from the meter 106 to the computing device 108 over the network 110 and the text or email can be created and transmitted by the computing device 108. In one aspect, the processor of the meter can be configured to receive a signal and in response to the signal the processor causes one or more of the relays to close, wherein the one or more relays are each associated with a respective phase of the poly-phase electrical system and were open prior to receiving the signal. In one aspect, the close signal can be received by the meter processor from the in-home device such as, for example, a thermostat. In another aspect, the close signal can be received by the meter processor from the computing device over a network such as an advanced metering infrastructure (AMI) network. Once the one or more relays are closed for the poly-phase electrical system, the meter processor can monitor the loads on each phase of the electrical system and use that information to update the threshold value for each phase of the poly-phase electrical system. In one aspect, the processor can be configured to transmit an email or text such as a SMS text to a designated address or telephone number in order to provide a notification that the one or more relays have been closed or to request authorization to close one or more relays. In one aspect, a request to transmit an email or text can be transmitted from the meter 106 to the computing device 108 over the network 110 and the text or email notification can be created and transmitted by the computing device 108. In one aspect, proper authentication such as a password must be received by the meter 106 or the computing device 108 before closing any of the one or more relays. In one aspect, the authentication can be transmitted to the meter 106 or the computing device 108 by an email or text message. For example, a utility worker can be located near the meter and send an SMS text to a designated telephone number. The text can contain a password or other form of authentication such as a digital certificate, which authorizes the one or more relays to be closed. In this manner, the utility worker can confirm that the relays can be closed in a dangerous situation.

Figure 2:
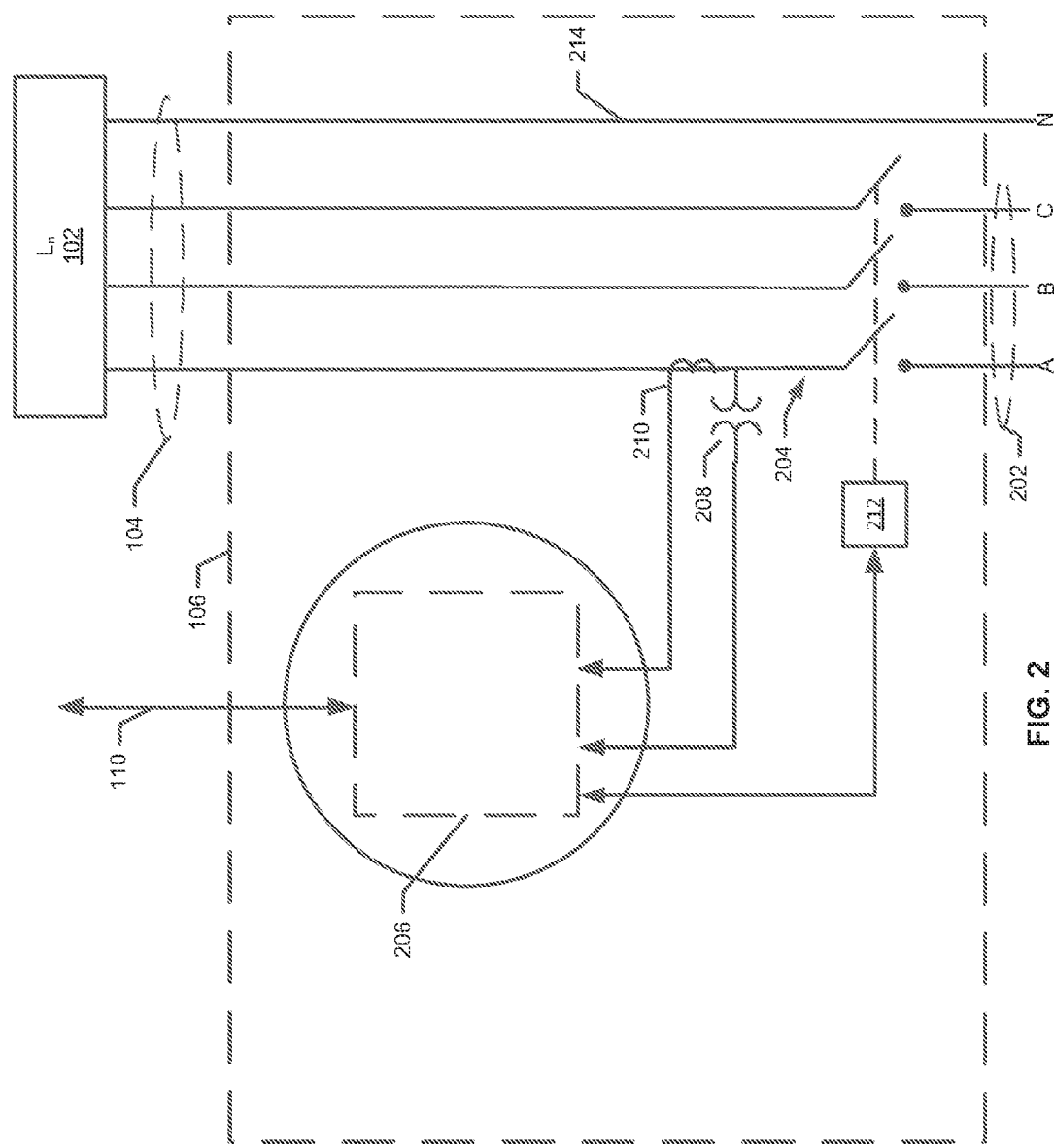
FIG. 2 illustrates an overview block diagram of a non-limiting embodiment of a meter that can be used to practice embodiments of the present invention.

FIG. 2 illustrates an overview block diagram of a non-limiting embodiment of a meter 106 that can be used to practice embodiments of the present invention. In this exemplary embodiment, the utility service is poly-phase electric power. Particularly, in FIG. 2 the electric service is three-phase, four-wire electric power generally comprised of three phase conductors 202 each carrying electric voltage and current that is generally displaced from one another by 120 degrees (e.g., phases A, B and C) and a separate neutral wire 214. It is to be appreciated, however, that the embodiments of the invention can be used with single- and poly-phase electrical systems such as two-phase, three-phase, four-phase, etc. Further comprising the embodiment of a meter 106 shown in FIG. 2 are one or more relays 204. There is at least one relay 204 for each phase conductor 202 and each relay 204 can be independently controlled by the meter's electronics 206 using a control mechanism 212. The relays 204, though shown as three single-pole, double-throw switches, can be a single switch or any combination of single or multi-pole switches that provide a means to selectively switch open or closed the phases 202 of the power feed 104 that provides electrical service to the load 102. In this manner, phases 202 that are lightly loaded or have no load can be disconnected from the load 102 thereby helping alleviate unbalanced conditions on the system 104. Similarly, when needed, the phases 202 can be closed using the respective relays 204, thereby providing power to the load. The load 102 can be provided with single-phase electrical service or poly-phase electrical service from among any combination of the plurality of phases 202. It is also to be appreciated that such a meter 106 can be configured to switch among two, three, four, five, etc. phases, and is not limited to just a three-phase configuration to provide electrical service to the load 102. As shown, in one aspect, the relays 204 can be controlled by a control mechanism 212 that actuates the relays 204 (i.e., causes the respective relay to open or close). The control mechanism 212 receives a control signal from the meter's electronics 206. Furthermore, in one aspect, the control mechanism 212 can provide a feedback signal to the meter's electronics 206 that indicates the position of the relays 204. In other words, the control mechanism 212 can inform the meter's electronics whether the load 102 is being provided single-phase or poly-phase electric service from among phase A, phase B, phase C, etc. (i.e., which phases are connected to the load 102), or whether the load 102 is disconnected from one or more phases 202 of the electric service.

Analog voltage and current inputs are also provided to meter electronics 206. In one aspect, the analog signals are derived from the electrical power feed 104 serving the load 102 and the one being metered by the meter 106. In another aspect, the analog signals are derived from a separate electrical source. In one aspect, the analog voltage signal can be provided by one or more potential transformers (PT) 208, if needed, though other means such as a voltage divider, capacitive coupling, or the like can be used. If the voltage level of the source is sufficiently low (e.g., 0.25 volts AC, or lower), then a PT 208 or other means of stepping down or transforming the voltage can be omitted. Similarly, in one aspect, the analog current signal can be provided by one or more current transformers (CT) 210. In one aspect, the one or more CTs 210 can have a turns ratio of 1:2500. In one aspect, one or more resistors (not shown) can be used to convert the current signal from the CT 210 into a voltage signal. Though shown in FIG. 2 as a single PT 208 and CT 210 connected to one phase (A phase), it is to be appreciated that any number of PTs 208 and CTs 210 can be used and can be connected to any combination or all of the phases 202 of the poly-phase electrical system 104.

In one aspect, the meter electronics 206 can comprise a memory (not shown in FIG. 2). The memory can be used to store a threshold value for each phase of the poly-phase electrical system. For example, the threshold value can be a value in current (amperes) or kilowatts or kilowatt-hours (kWH) below which the relay for that respective phase will be opened thereby disconnecting that phase from the load 102. In one aspect, the threshold value for each phase can be different for each phase. The threshold value can be stored in the memory in the form of a matrix, such as a 3×1 matrix or a 1×3 matrix (for a three-phase system). In one aspect, the meter electronics are configured to determine the threshold value for each phase by monitoring the current, watts, or kWH for each phase over a period of time to determine normal load conditions. In one aspect, the threshold value can be set as a percentage of the normal value. For example, the threshold value for one phase can be set such that the relay for that phase opens if the current in the phase is 50 percent of the normal load current. In one aspect, if the normal loading conditions change, the threshold values for one or more of the phases can be updated by the meter electronics and stored in the memory.

In another aspect, the phase thresholds can be stored in the meter 106 manually by a user that has authorization to write to the memory using, for example, infrared, near-field communications such as BlueTooth, Wi-Fi, RF, RFID, and the like, or by connecting a device such as a computer to the meter 106 using a bus connection. In another aspect, the phase thresholds can be communicated to the memory in the meter's electronics 206 via a network 110 that is operably connected with the meter's electronics 206. In one aspect, the network 110 is an advanced metering infrastructure (AMI) network. Once the phase threshold is stored in the memory, it can be transmitted over the network 110 to, for example, the computing device 108 or it can be read from the memory by a user with proper authorization and equipment.

In one aspect, the electronics 206 comprise at least a memory and one or more processors and provide an interface for receiving a signal from the network 110 and causing one or more of the relays 204 to actuate via the control mechanism 212. The memory of the meter electronics 206 can be used to store phase thresholds as described above. The meter electronics 206 can comprise a transmitter that can be used to transmit at least the phase thresholds and notifications over the network 110 to a separate computing device 108. In one aspect, the meter's electronics 206 can comprise one or more metering micro-controllers including a Teridian 6533 controller or a Teridian 6521 controller as are available from Maxim Integrated Products, Inc. (Sunnyvale, California), among others. In one aspect, the one or more processors can perform metering functions such as determining the number of kilowatt-hours (kWH) of electricity consumed by the load 102.

In one aspect, the one or more processors of the meter electronics 206 can be configured to determine a load value for each phase 202 of a poly-phase electrical system 104. The determined load value for each phase of the poly-phase electrical system 104 can be compared with a respective threshold value for each phase of the poly-phase electrical system 104 stored in the memory. In one aspect, the threshold values are stored in the meter's 106 memory and this comparison is performed by a processor within the meter electronics 206. In another aspect, the determined values are transmitted over a network 110 and compared to the threshold values using a remote computing device 108. If the comparison determines that the load value for one or more of the phases is less than the threshold value for that phase, then the respective one or more of the plurality of relays are opened. In one aspect, the meter electronics 206 send a signal to the control 212 to open the respective relays. In another aspect, an open signal or an authorization to open is received over the network 110 by the meter electronics 206 and the respective one or more relays are opened in accordance with the open signal or the authorization. In one aspect, the meter electronics 206 can provide an alarm signal upon opening the one or more of the plurality of relays when the comparison determines that the load value for that phase is less than the respective threshold value for that phase. The alarm signal can be transmitted over the network 110 to the remote computing device 108 and/or to an in-home device. In one aspect, signals, such as the alarm signal, can be transmitted wirelessly to and received wirelessly from an in-home device as described herein. In yet another aspect, the meter electronics 206 can be configured to transmit an email or text such as a SMS text to a designated address or telephone number in order to provide an alarm notification. In one aspect, a request to transmit an email or text can be transmitted from the meter electronics 206 to the computing device 108 over the network 110 and the text or email can be created and transmitted by the computing device 108.

In one aspect, the meter electronics 206 can be configured to receive a signal and in response to the signal the meter electronics 206 cause one or more of the relays to close, wherein the one or more relays are each associated with respective phase of the poly-phase electrical system and were open prior to receiving the signal. In one aspect, the close signal can be received by the meter electronics 206 from the in-home device such as, for example, a thermostat. In another aspect, the close signal can be received by the meter electronics 206 from the computing device over a network 110 such as an advanced metering infrastructure (AMI) network. Once the one or more relays are closed for the poly-phase electrical system, the meter electronics 206 can monitor the loads on each phase of the electrical system and use that information to update the threshold value for each phase of the poly-phase electrical system. In one aspect, the meter electronics 206 can be configured to transmit an email or text such as a SMS text to a designated address or telephone number in order to provide a notification that the one or more relays have been closed or to request authorization to close one or more relays. In one aspect, a request to transmit an email or text can be transmitted from the meter electronics 206 to the computing device 108 over the network 110 and the text or email notification can be created and transmitted by the computing device 108. In one aspect, proper authentication such as a password must be received by the meter 106 or the computing device 108 before closing any of the one or more relays. In one aspect, the authentication can be transmitted to the meter 106 or the computing device 108 by an email or text message. For example, a utility worker can be located near the meter and send an SMS text to a designated telephone number. The text can contain a password or other form of authentication such as a digital certificate, which authorizes the one or more relays to be closed. In this manner, the utility worker can confirm that the relays can be closed in a dangerous situation.

Figure 3:
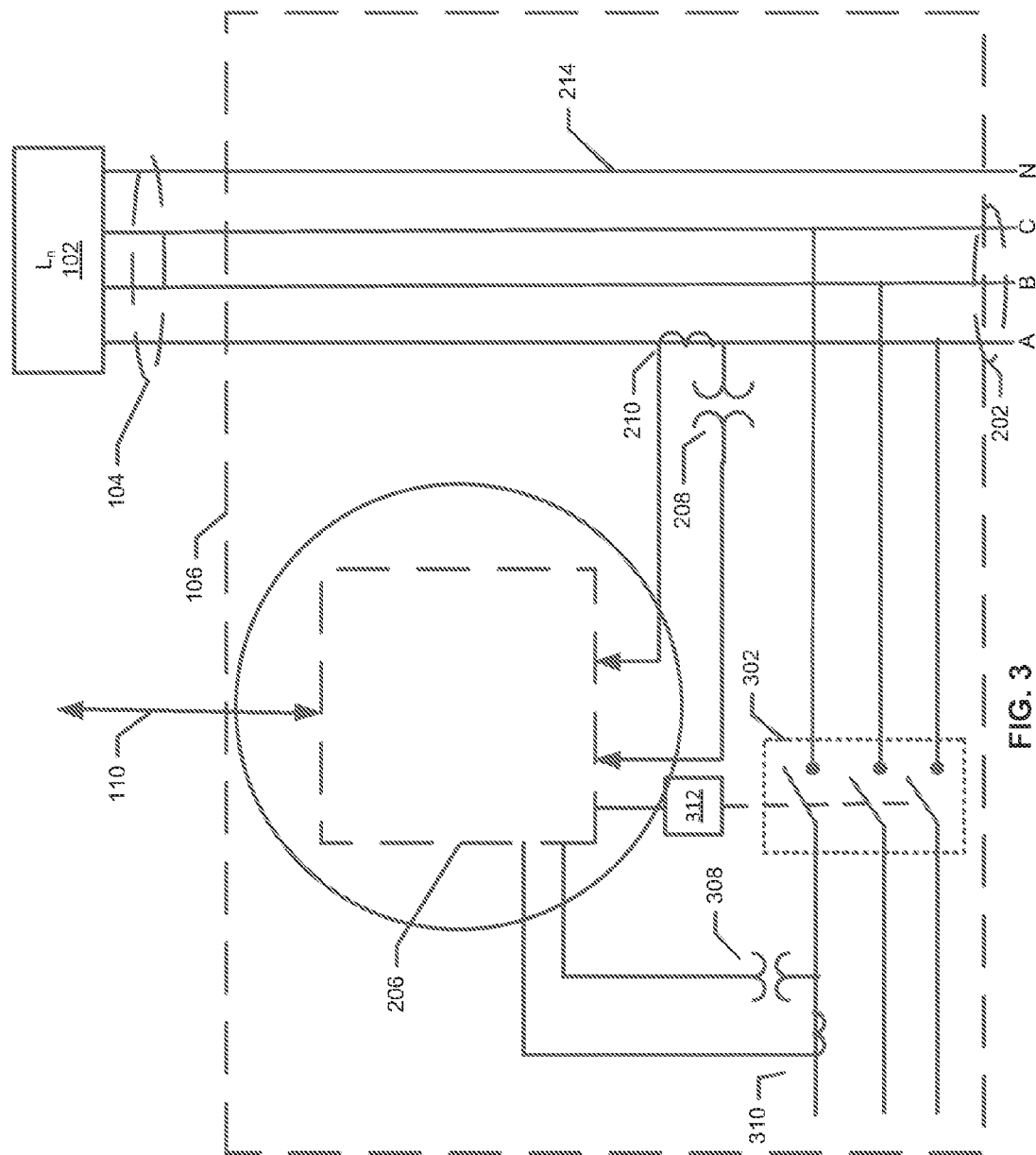
FIG. 3 illustrates an embodiment of a meter used to meter a poly-phase electrical service serving a load.

FIG. 3 illustrates an embodiment of a meter 106 used to meter a poly-phase electrical service 104 serving a load 102. In this embodiment, the poly-phase electrical service 104 is a three-phase service comprised of phase conductors 202 for phase A, phase B and phase C, and a neutral wire 214. In other embodiments, there can be more or fewer electrical phases and phase conductors. In the embodiment shown in FIG. 3, a load control relay (LCR) 302 is provided. The LCR 302 can be used to turn on or off select loads using the meter 106. For example, the LCR 302 can be used to turn on or off power to a hot water heater, swimming pool pump or heater, air conditioning equipment, etc. In one aspect, the LCR 302 can have a 40-amp rating. In another aspect, the LCR 302 can have a two-amp rating. In one aspect, the LCR 302 can be controlled by control 312 that receives control signals from the meter's electronics 206. It is to be appreciated that control 312 can control the LCR 302 independently for each phase (e.g. the LCR 302 for Phase A can be closed while the LCRs 302 for phases B and C stay open, etc.). In another aspect, the LCR 302 can receive control signals external from the meter 106. For example, the LCR 302 can receive a signal from the network 110 (wired or wireless) causing the LCR 302 for one or more phases to open or close. Furthermore, in one aspect, the control mechanism 312 can provide a feedback signal to the meter's electronics 206 that indicates the position of the LCRs 302. In other words, the control mechanism 312 can inform the meter's electronics 206 whether the LCR 302 for phase A, phase B, phase C is closed or open.

As described above, in one aspect, the meter electronics 206 can comprise a memory (not shown in FIG. 3). The memory can be used to store a threshold value for each phase of the poly-phase electrical system. For example, the threshold value can be a value in current (amperes) or kilowatts or kilowatt-hours (kWH) below which the LCR 302 for that respective phase will be opened. In one aspect, the threshold value for each phase can be different for each phase. The threshold value can be stored in the memory in the form of a matrix, such as a 3×1 matrix or a 1×3 matrix (for a three-phase system). In one aspect, the meter electronics are configured to determine the threshold value for each phase by monitoring the current, watts, or kWH for each phase over a period of time to determine normal load conditions using, for example, PT 308 and CT 310 (though only shown as one set of PTs 308 and CTs 310, it is to be appreciated that any number or combination of PTs 308 and CTs 310 are contemplated within the scope of the embodiments of the invention). In one aspect, the threshold value can be set as a percentage of the normal value. For example, the threshold value for one phase can be set such that the LCR 302 for that phase opens if the current in the phase is 50 percent of the normal load current. In one aspect, if the normal loading conditions change, the threshold values for one or more of the phases can be updated by the meter electronics 206 and stored in the memory.

In another aspect, the phase thresholds can be stored in the meter 106 manually by a user that has authorization to write to the memory using, for example, infrared, near-field communications such as BlueTooth, Wi-Fi, RF, RFID, and the like, or by connecting a device such as a computer to the meter 106 using a bus connection. In another aspect, the phase thresholds can be communicated to the memory in the meter's electronics 206 via a network 110 that is operably connected with the meter's electronics 206. In one aspect, the network 110 is an advanced metering infrastructure (AMI) network. Once the phase threshold is stored in the memory, it can be transmitted over the network 110 to, for example, the computing device 108 or it can be read from the memory by a user with proper authorization and equipment.

In one aspect, the electronics 206 comprise at least a memory and one or more processors and provide an interface for receiving a signal from the network 110 and causing one or more of the LCRs 302 to actuate via the control mechanism 312. The memory of the meter electronics 206 can be used to store phase thresholds as described above. The meter electronics 206 can comprise a transmitter that can be used to transmit at least the phase thresholds over the network 110 to a separate computing device 108. In one aspect, the meter's electronics 206 can comprise one or more metering microcontrollers including a Teridian 6533 controller or a Teridian 6521 controller as are available from Maxim Integrated Products, Inc. (Sunnyvale, Calif.), among others. In one aspect, the one or more processors can perform metering functions such as determining the number of kilowatt-hours (kWH) of electricity consumed by the load 102.

In one aspect, the one or more processors of the meter electronics 206 can be configured to determine a load value for the LCR 302 for each phase 202 of a poly-phase electrical system 104. The determined load value for each phase of the poly-phase electrical system 104 can be compared with a respective threshold value for the LCR 302 of each phase of the poly-phase electrical system 104 stored in the memory. In one aspect, the threshold values are stored in the meter's 106 memory and this comparison is performed by a processor within the meter electronics 206. In another aspect, the determined values are transmitted over a network 110 and compared to the threshold values using a remote computing device 108. If the comparison determines that the load value for one or more of the phases is less than the threshold value for that phase, then the respective one or more of the plurality of LCRs 302 are opened. In one aspect, the meter electronics 206 send a signal to the control 312 to open the respective LCR 302. In another aspect, an open signal or an authorization to open is received over the network 110 by the meter electronics 206 and the respective one or more LCRs 302 are opened in accordance with the open signal or the authorization. In one aspect, the meter electronics 206 can provide an alarm signal upon opening the one or more of the plurality of LCRs 302 when the comparison determines that the load value for that phase is less than the respective threshold value for that phase. The alarm signal can be transmitted over the network 110 to the remote computing device 108 and/or to an in-home device. In yet another aspect, the meter electronics 206 can be configured to transmit an email or text such as a SMS text to a designated address or telephone number in order to provide an alarm notification. In one aspect, a request to transmit an email or text can be transmitted from the meter electronics 206 to the computing device 108 over the network 110 and the text or email can be created and transmitted by the computing device 108.

In one aspect, the meter electronics 206 can be configured to receive a signal and in response to the signal the meter electronics 206 cause one or more of the LCRs 302 to close, wherein the one or more LCRs 302 are each associated with a respective phase of the poly-phase electrical system and were open prior to receiving the signal. In one aspect, the close signal can be received by the meter electronics 206 from the in-home device such as, for example, a thermostat. In another aspect, the close signal can be received by the meter electronics 206 from the computing device 108 over a network 110 such as an advanced metering infrastructure (AMI) network. Once the one or more LCRs 302 are closed for the poly-phase electrical system, the meter electronics 206 can monitor the loads on each phase of the electrical system and use that information to update the threshold value for each phase of the poly-phase electrical system. In one aspect, the meter electronics 206 can be configured to transmit an email or text such as a SMS text to a designated address or telephone number in order to provide a notification that the one or more LCRs 302 have been closed or to request authorization to close one or more LCRs 302. In one aspect, a request to transmit an email or text can be transmitted from the meter electronics 206 to the computing device 108 over the network 110 and the text or email notification can be created and transmitted by the computing device 108. In one aspect, proper authentication such as a password must be received by the meter 106 or the computing device 108 before closing any of the one or more the LCRs 302. In one aspect, the authentication can be transmitted to the meter 106 or the computing device 108 by an email or text message. For example, a utility worker can be located near the meter and send an SMS text to a designated telephone number. The text can contain a password or other form of authentication such as a digital certificate, which authorizes the one or more LCRs 302 to be closed. In this manner, the utility worker can confirm that the LCRs can be closed in a dangerous situation.

Figure 4:
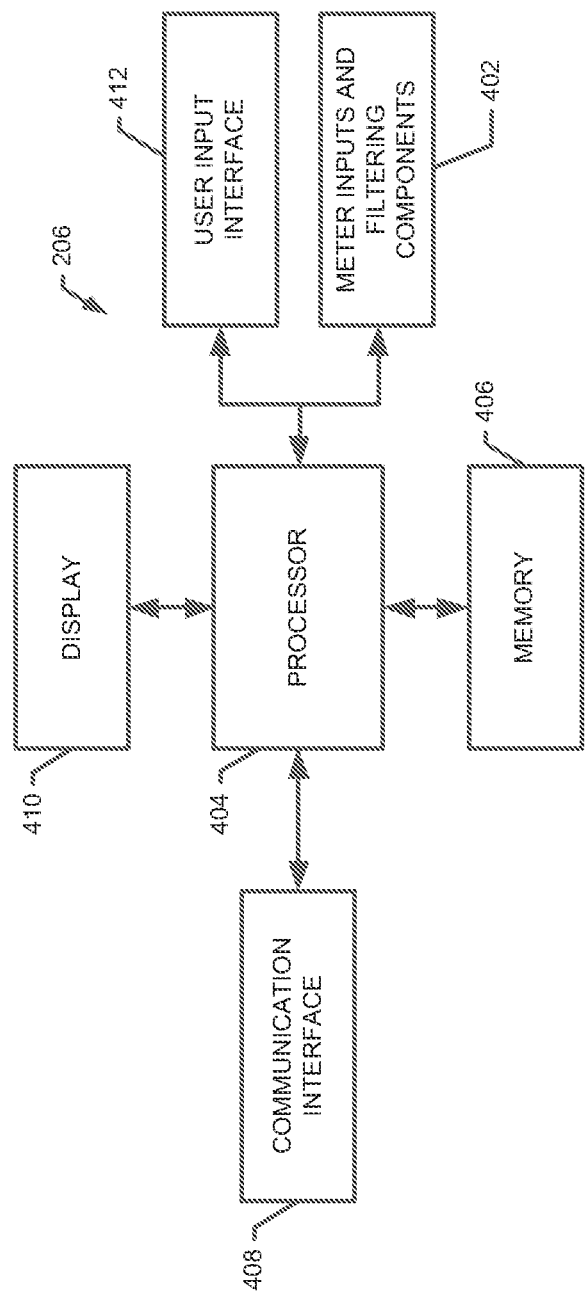
FIG. 4 illustrates a block diagram of an entity capable of operating as meter electronics in accordance with one embodiment of the present invention.

Referring now to FIG. 4, a block diagram of an entity capable of operating as meter electronics 206 is shown in accordance with one embodiment of the present invention. The entity capable of operating as meter electronics 206 includes various means for performing one or more functions in accordance with embodiments of the present invention, including those more particularly shown and described herein. It should be understood, however, that one or more of the entities may include alternative means for performing one or more like functions, without departing from the spirit and scope of the present invention. As shown, the entity capable of operating as meter electronics 206 can generally include means, such as one or more processors 404 for performing or controlling the various functions of the entity. As shown in FIG. 4, in one embodiment, meter electronics 206 can comprise metering components such as meter inputs and filtering components 402. In one aspect, the meter inputs and filter components 402 can comprise voltage and current inputs, one or more ADCs, filtering components, and the like. Further comprising this embodiment of meter electronics 206 are one or more processors 404 and memory 406.

In one embodiment, the one or more processors 404 are in communication with or include memory 406, such as volatile and/or non-volatile memory that stores content, data or the like. For example, the memory 406 may store content transmitted from, and/or received by, the entity. Also for example, the memory 406 may store software applications, instructions or the like for the one or more processors 404 to perform steps associated with operation of the entity in accordance with embodiments of the present invention. In particular, the one or more processors 404 may be configured to perform the processes discussed in more detail herein for determining a load value for each phase of a poly-phase electrical system; comparing, using the processor 404, the load value for each phase of a poly-phase electrical system with a respective threshold value for each phase of the poly-phase electrical system. In one aspect, the threshold value for each phase of the poly-phase electrical system is stored in the memory 406. The meter electronics can cause one or more of the relays (relays 204 or LCRs 302) to be opened or closed based on the comparison, wherein the one or more relays are each associated with respective phase of the poly-phase electrical system.

In addition to the memory 406, the one or more processors 404 can also be connected to at least one interface or other means for displaying, transmitting and/or receiving data, content or the like. In this regard, the interface(s) can include at least one communication interface 408 or other means for transmitting and/or receiving data, content or the like over, for example, network 110, as well as at least one user interface that can include a display 410 and/or a user input interface 412. In one aspect, the communication interface 408 can be used to receive or transfer a phase threshold stored in the memory 406 to a remote computing device 108 such as the one described below over a network 110, or the communication interface can be used to receive or transmit an open/close signal and alarm signals from and to the remote computing device 108 and/or an in-home device, respectively. In one aspect, the network 110 is an advanced metering infrastructure (AMI) network. In one aspect, the communication interface 408 can comprise a wireless communication interface such as a Wi-Fi transceiver. The user input interface 412, in turn, can comprise any of a number of devices allowing the entity to receive data from a user, such as a keypad, a touch display, a joystick or other input device.

Figure 5:
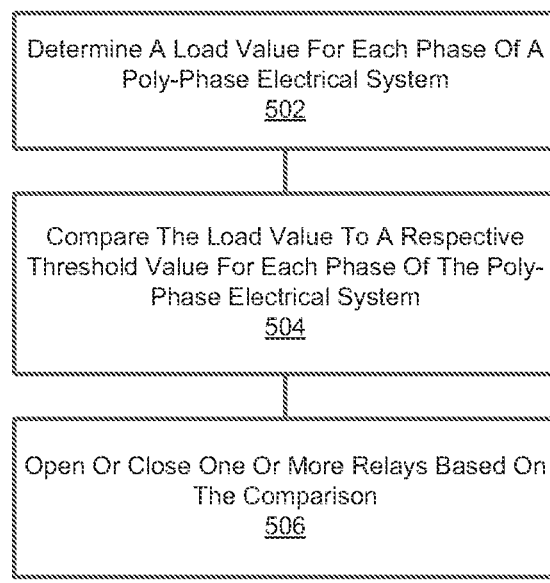
FIG. 5 is a flowchart illustrating the operations that may be taken for phase functionality in a meter.

Referring now to FIG. 5, the operations are illustrated that may be taken for automatically enabling or disabling phase functionality in a poly-phase electric utility meter. At step 502, a load value is determined for each phase of a poly-phase electrical system. In one aspect, the load value is determined by monitoring the loading on each phase during normal loading over a period of time. The load value can comprise, for example, a value for current, watts, kWH, and the like. At step 504, the determined load value is compared to a respective threshold value for each phase of the poly-phase electrical system. In one aspect, the threshold value is determined by monitoring normal loading for a phase and setting the threshold value as a value that is lower or higher than the normal loading value. In one aspect, the threshold values can be programmed into the memory by a person having authorization and the proper equipment and software. In another aspect, the threshold values can be transmitted to the meter 106 over a network 110 from a computing device 108. The respective threshold value for each phase of a poly-phase electrical system can be different from that of the other phases that comprise the system. The threshold value can be stored in a memory on the meter 106, or a memory of a computing device 108, or in both memories. The comparison can be performed by a processor in the meter 106, or a processor in a computing device 108. At step 506, one or more relays can be opened or closed based on the comparison. In one aspect, the one or more relays are within or associated with the meter 106. In one aspect, opening or closing one or more relays based on the comparison comprises opening the respective relay of the phase when the comparison determines that the load value for that phase is less than the respective threshold value for that phase. In one aspect, the respective relay is opened in response to an open signal that is received by the meter processor from a computing device 108 over a network 110. In one aspect, the meter processor can provide an alarm signal upon opening the respective relay of the phase when the comparison determines that the load value for that phase is less than the respective threshold value for that phase. The alarm signal can be provided by the processor to an in-home device such as, for example, an in-home display, thermostat, computer, television, and the like. In one aspect, the alarm signal can be in the form of a text message or an email, as described herein. In one aspect, the meter processor can receive a close signal and in response to the signal close one or more of the relays, wherein the one or more relays are each associated with respective phase of the poly-phase electrical system and were open prior to receiving the signal. In one aspect, the close signal can be received by the processor from an in-home device such as those described herein. In another aspect, the close signal can be received by the processor from a computing device 108 over a network 110 such as an advanced metering infrastructure (AMI) network and the like. In one aspect, the meter electronics 206 can be configured to transmit an email or text such as a SMS text to a designated address or telephone number in order to provide a notification that the one or more relays have been closed or to request authorization to close one or more relays. In one aspect, a request to transmit an email or text can be transmitted from the meter electronics 206 to the computing device 108 over the network 110 and the text or email notification can be created and transmitted by the computing device 108. In one aspect, proper authentication such as a password must be received by the meter 106 or the computing device 108 before closing any of the one or more the relays. In one aspect, the authentication can be transmitted to the meter 106 or the computing device 108 by an email or text message. For example, a utility worker can be located near the meter and send an SMS text to a designated telephone number. The text can contain a password or other form of authentication such as a digital certificate, which authorizes the one or more relays to be closed. In this manner, the utility worker can confirm that the relays can be closed in a dangerous situation. In one aspect, the threshold values can be updated after the one or more relays have been closed if the loading conditions have changed.

The above system has been described above as comprised of units. One skilled in the art will appreciate that this is a functional description and that software, hardware, or a combination of software and hardware can perform the respective functions. A unit, such as a smart appliance, a smart meter, a smart grid, a utility computing device, a vendor or manufacturer's computing device, etc., can be software, hardware, or a combination of software and hardware. The units can comprise the phase functionality software 606 as illustrated in FIG. 6 and described below. In one exemplary aspect, the units can comprise a computing device 108 as referenced above and further described below.

FIG. 6 is a block diagram illustrating an exemplary operating environment for performing the disclosed methods. This exemplary operating environment is only an example of an operating environment and is not intended to suggest any limitation as to the scope of use or functionality of operating environment architecture. Neither should the operating environment be interpreted as having any dependency or requirement relating to any one or combination of components illustrated in the exemplary operating environment.

The present methods and systems can be operational with numerous other general purpose or special purpose computing system environments or configurations. Examples of well known computing systems, environments, and/or configurations that can be suitable for use with the systems and methods comprise, but are not limited to, personal computers, server computers, laptop devices, and multiprocessor systems. Additional examples comprise set top boxes, programmable consumer electronics, network PCs, minicomputers, mainframe computers, smart meters, smart-grid components, distributed computing environments that comprise any of the above systems or devices, and the like.

The processing of the disclosed methods and systems can be performed by software components. The disclosed systems and methods can be described in the general context of computer-executable instructions, such as program modules, being executed by one or more computers or other devices. Generally, program modules comprise computer code, routines, programs, objects, components, data structures, etc. that perform particular tasks or implement particular abstract data types. The disclosed methods can also be practiced in grid-based and distributed computing environments where tasks are performed by remote processing devices that are linked through a communications network. In a distributed computing environment, program modules can be located in both local and remote computer storage media including memory storage devices.

Further, one skilled in the art will appreciate that the systems and methods disclosed herein can be implemented via a general-purpose computing device in the form of a computing device 108. The components of the computing device 108 can comprise, but are not limited to, one or more processors or processing units 603, a system memory 612, and a system bus 613 that couples various system components including the processor 603 to the system memory 612. In the case of multiple processing units 603, the system can utilize parallel computing. In one aspect, the processor 603 can be configured to receive a load value for one or more phases of a poly-phase electrical system, compare the one or more load values to a respective threshold value for the respective phases of the poly-phase electrical system and send an actuation signal to a smart meter to open or close one or more relays based on the comparison.

The system bus 613 represents one or more of several possible types of bus structures, including a memory bus or memory controller, a peripheral bus, an accelerated graphics port, and a processor or local bus using any of a variety of bus architectures. By way of example, such architectures can comprise an Industry Standard Architecture (ISA) bus, a Micro Channel Architecture (MCA) bus, an Enhanced ISA (EISA) bus, a Video Electronics Standards Association (VESA) local bus, an Accelerated Graphics Port (AGP) bus, and a Peripheral Component Interconnects (PCI), a PCI-Express bus, a Personal Computer Memory Card Industry Association (PCMCIA), Universal Serial Bus (USB) and the like. The bus 613, and all buses specified in this description can also be implemented over a wired or wireless network connection and each of the subsystems, including the processor 603, a mass storage device 604, an operating system 605, phase functionality software 606, phase functionality data 607, a network adapter 608, system memory 612, an Input/Output Interface 610, a display adapter 609, a display device 611, and a human machine interface 602, can be contained within one or more remote computing devices, clients or meters 614*a,b,c* at physically separate locations, connected through buses of this form, in effect implementing a fully distributed system or distributed architecture.

The computing device 108 typically comprises a variety of computer readable media. Exemplary readable media can be any available media that is non-transitory and accessible by the computing device 108 and comprises, for example and not meant to be limiting, both volatile and non-volatile media, removable and non-removable media. The system memory 612 comprises computer readable media in the form of volatile memory, such as random access memory (RAM), and/or non-volatile memory, such as read only memory (ROM). The system memory 612 typically contains data such as phase functionality data 607 and/or program modules such as operating system 605 and phase functionality software 606 that are immediately accessible to and/or are presently operated on by the processing unit 603.

In another aspect, the computing device 108 can also comprise other non-transitory, removable/non-removable, volatile/non-volatile computer storage media. By way of example, FIG. 6 illustrates a mass storage device 604 that can provide non-volatile storage of computer code, computer readable instructions, data structures, program modules, and other data for the computing device 108. For example and not meant to be limiting, a mass storage device 604 can be a hard disk, a removable magnetic disk, a removable optical disk, magnetic cassettes or other magnetic storage devices, flash memory cards, CD-ROM, digital versatile disks (DVD) or other optical storage, random access memories (RAM), read only memories (ROM), electrically erasable programmable read-only memory (EEPROM), and the like.

Optionally, any number of program modules can be stored on the mass storage device 604, including by way of example, an operating system 605 and phase functionality software 606. Each of the operating system 605 and phase functionality software 606 (or some combination thereof) can comprise elements of the programming and the phase functionality software 606. Phase functionality data 607 can also be stored on the mass storage device 604. Phase functionality data 607 can be stored in any of one or more databases known in the art. Examples of such databases comprise, DB2® (IBM Corporation, Armonk, N.Y.), Microsoft® Access, Microsoft® SQL Server, (Microsoft Corporation, Bellevue, Wash.), Oracle®, (Oracle Corporation, Redwood Shores, California), mySQL, PostgreSQL, and the like. The databases can be centralized or distributed across multiple systems.

In another aspect, the user can enter commands and information into the computing device 108 via an input device (not shown). Examples of such input devices comprise, but are not limited to, a keyboard, pointing device (e.g., a "mouse"), a microphone, a joystick, a scanner, tactile input devices such as gloves, and other body coverings, and the like These and other input devices can be connected to the processing unit 603 via a human machine interface 602 that is coupled to the system bus 613, but can be connected by other interface and bus structures, such as a parallel port, game port, an IEEE 1394 Port (also known as a Firewire port), a serial port, or a universal serial bus (USB).

In yet another aspect, a display device 611 can also be connected to the system bus 613 via an interface, such as a display adapter 609. It is contemplated that the computing device 108 can have more than one display adapter 609 and the computing device 108 can have more than one display device 611. For example, a display device can be a monitor, an LCD (Liquid Crystal Display), a projector, and the like. In addition to the display device 611, other output peripheral devices can comprise components such as speakers (not shown) and a printer (not shown), which can be connected to the computer 108 via Input/Output Interface 610. Any step and/or result of the methods can be output in any form to an output device. Such output can be any form of visual representation, including, but not limited to, textual, graphical, animation, audio, tactile, and the like.

The computing device 108 can operate in a networked environment using logical connections to one or more remote computing devices, clients or meters 614*a,b,c*. By way of example, a remote computing device 614 can be a personal computer, a portable computer, a server, a router, a network computer, a smart meter, a vendor or manufacturer's computing device, smart grid components, a peer device or other common network node, and so on. Logical connections between the computing device 108 and a remote computing device or client 614*a,b,c* can be made via a local area network (LAN) and a general wide area network (WAN). Such network connections can be through a network adapter 608. A network adapter 608 can be implemented in both wired and wireless environments. Such networking environments are conventional and commonplace in offices, enterprise-wide computer networks, intranets, and other networks 110 such as the Internet or an AMI network.

For purposes of illustration, application programs and other executable program components such as the operating system 605 are illustrated herein as discrete blocks, although it is recognized that such programs and components reside at various times in different storage components of the computing device 108, and are executed by the data processor(s) of the computer. An implementation of phase functionality software 606 can be stored on or transmitted across some form of computer readable media. Any of the disclosed methods can be performed by computer readable instructions embodied on computer readable media. Computer readable media can be any available media that can be accessed by a computer. By way of example and not meant to be limiting, computer readable media can comprise "computer storage media" and "communications media." "Computer storage media" comprises volatile and non-volatile, removable and non-removable media implemented in any methods or technology for storage of information such as computer readable instructions, data structures, program modules, or other data. Exemplary computer storage media comprises, but is not limited to, RAM, ROM, EEPROM, flash memory or other memory technology, CD-ROM, digital versatile disks (DVDs) or other optical storage, magnetic cassettes, magnetic tape, magnetic disk storage or other magnetic storage devices, or any other medium which can be used to store the desired information and which can be accessed by a computer.

The methods and systems can employ Artificial Intelligence techniques such as machine learning and iterative learning. Examples of such techniques include, but are not limited to, expert systems, case based reasoning, Bayesian networks, behavior based AI, neural networks, fuzzy systems, evolutionary computation (e.g. genetic algorithms), swarm intelligence (e.g. ant algorithms), and hybrid intelligent systems (e.g. Expert inference rules generated through a neural network or production rules from statistical learning).

As described above and as will be appreciated by one skilled in the art, embodiments of the present invention may be configured as a system, method, or computer program product. Accordingly, embodiments of the present invention may be comprised of various means including entirely of hardware, entirely of software, or any combination of software and hardware. Furthermore, embodiments of the present invention may take the form of a computer program product on a computer-readable storage medium having computer-readable program instructions (e.g., computer software) embodied in the storage medium. Any suitable non-transitory computer-readable storage medium may be utilized including hard disks, CD-ROMs, optical storage devices, or magnetic storage devices.

Embodiments of the present invention have been described above with reference to block diagrams and flowchart illustrations of methods, apparatuses (i.e., systems) and computer program products. It will be understood that each block of the block diagrams and flowchart illustrations, and combinations of blocks in the block diagrams and flowchart illustrations, respectively, can be implemented by various means including computer program instructions. These computer program instructions may be loaded onto a general purpose computer, special purpose computer, or other programmable data processing apparatus, such as the one or more processors 603 discussed above with reference to FIG. 6 or the one or more processors 404 of FIG. 4, to produce a machine, such that the instructions which execute on the computer or other programmable data processing apparatus create a means for implementing the functions specified in the flowchart block or blocks.

These computer program instructions may also be stored in a computer-readable memory that can direct a computer or other programmable data processing apparatus (e.g., one or more processors 603 of FIG. 6 or the one or more processors 404 of FIG. 4,) to function in a particular manner, such that the instructions stored in the computer-readable memory produce an article of manufacture including computer-readable instructions for implementing the function specified in the flowchart block or blocks. The computer program instructions may also be loaded onto a computer or other programmable data processing apparatus to cause a series of operational steps to be performed on the computer or other programmable apparatus to produce a computer-implemented process such that the instructions that execute on the computer or other programmable apparatus provide steps for implementing the functions specified in the flowchart block or blocks.

Accordingly, blocks of the block diagrams and flowchart illustrations support combinations of means for performing the specified functions, combinations of steps for performing the specified functions and program instruction means for performing the specified functions. It will also be understood that each block of the block diagrams and flowchart illustrations, and combinations of blocks in the block diagrams and flowchart illustrations, can be implemented by special purpose hardware-based computer systems that perform the specified functions or steps, or combinations of special purpose hardware and computer instructions.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is no way intended that an order be inferred, in any respect. This holds for any possible non-express basis for interpretation, including: matters of logic with respect to arrangement of steps or operational flow; plain meaning derived from grammatical organization or punctuation; and the number or type of embodiments described in the specification.

Throughout this application, various publications may be referenced. The disclosures of these publications in their entireties are hereby incorporated by reference into this application in order to more fully describe the state of the art to which the methods and systems pertain.

Many modifications and other embodiments of the invention set forth herein will come to mind to one skilled in the art to which these embodiments of the invention pertain having the benefit of the teachings presented in the foregoing descriptions and the associated drawings. Therefore, it is to be understood that the embodiments of the invention are not to be limited to the specific embodiments disclosed and that modifications and other embodiments are intended to be included within the scope of the appended claims. Moreover, although the foregoing descriptions and the associated drawings describe exemplary embodiments in the context of certain exemplary combinations of elements and/or functions, it should be appreciated that different combinations of elements and/or functions may be provided by alternative embodiments without departing from the scope of the appended claims. In this regard, for example, different combinations of elements and/or functions than those explicitly described above are also contemplated as may be set forth in some of the appended claims. Although specific terms are employed herein, they are used in a generic and descriptive sense only and not for purposes of limitation.

What is claimed is:

1. A method comprising:
    determining a load value for each phase of power of a poly-phase electrical system;
    comparing, using a processor, the load value for each phase of power of a poly-phase electrical system with a respective threshold value for each phase of power of the poly-phase electrical system, wherein each respective threshold value is determined by:

monitoring a current for each phase over a period of time;

determining a normal load value for each phase based on monitoring a current for each phase over a predetermined period of time; and setting each respective threshold value to a percentage of the normal load value so that each respective threshold value is less than the normal load value; and opening or closing one or more relays based on the comparison, wherein the one or more relays are each associated with a respective phase of power of the poly-phase electrical system, wherein each of the one or more relays corresponds only to a single phase conductor configured to transmit only the respective phase of power along the single phase conductor, wherein each of the one or more relays is configured to terminate all transmission of the respective phase of power based on the comparison, and wherein a feedback signal indicating a position of each of the one or more relays is transmitted to one or more meters associated with the poly-phase electrical system.

2. The method of claim 1, wherein opening or closing one or more relays based on the comparison comprises opening the respective relay of the phase of power when the comparison determines that the load value for that phase of power is less than the respective threshold value for that phase of power.

3. The method of claim 2, wherein the respective relay is opened in response to an open signal that is received by the processor from a computing device over a network.

4. The method of claim 2 further comprising the processor providing an alarm signal upon opening the respective relay of the phase of power when the comparison determines that the load value for that phase of power is less than the respective threshold value for that phase of power.

5. The method of claim 4, wherein the alarm signal is provided by the processor to an in-home device.

6. The method of claim 4, wherein the alarm signal is a text message or an email sent to a designated telephone number or email address.

7. The method of claim 1 further comprising the processor receiving a signal and in response to the signal closing one or more of the relays, wherein the one or more relays are each associated with a respective phase of power of the poly-phase electrical system and were open prior to receiving the signal.

8. The method of claim 7, wherein the signal is received by the processor from a thermostat.

9. The method of claim 7, wherein the signal is received by the processor from a computing device over a network.

10. The method of claim 9, wherein the network is an advanced metering infrastructure network.

11. The method of claim 7, wherein authorization must be received before closing one or more of the relays.

12. The method of claim 11, wherein the authorization is received as a password in a text message or email.

13. The method of claim 7 further comprising the processor providing an alarm signal before or upon closing one or more of the relays.

14. The method of claim 13, wherein the alarm signal is provided by the processor to an in-home device.

15. The method of claim 13, wherein the alarm signal is a text message or an email sent to a designated telephone number or email address.

16. The method of claim 7, further comprising updating the threshold value for one or more phases of power of the poly-phase electrical system based on one or more changes in the normal load value for each phase.

17. A system comprised of:

a memory, wherein a threshold value for each phase of power of a poly-phase electrical system is stored on the memory;

a plurality of relays, wherein each one of the plurality of relays is configured to electrically open or close a respective phase of power of the poly-phase electrical system; and a processor, wherein the processor is operably connected with the memory and the plurality of relays, and wherein the processor is configured to:

determine a load value for each phase of power of a poly-phase electrical system;

compare the load value for each phase of power of a poly-phase electrical system with a respective threshold value for each phase of power of the poly-phase electrical system stored in the memory, wherein to determine each respective threshold value the processor is further configured to:

monitor a current for each phase over a period of time;

determine a normal load value for each phase based on monitoring a current for each phase over a predetermined period of time; and set each respective threshold value to a percentage of the normal load value so that each respective threshold value is less than the normal load value; and open or close one or more of the plurality of relays based on the comparison, wherein each one of the plurality of relays corresponds only to a single phase conductor configured to transmit only the respective phase of power along the single phase conductor, wherein each one of the plurality of relays is configured to terminate all transmission of the respective phase of power based on the comparison, and wherein a feedback signal indicating a position of each of the one or more relays is transmitted to one or more meters associated with the poly-phase electrical system.

18. The system of claim 17, wherein opening or closing one or more relays based on the comparison comprises opening the respective relay of the phase of power when the comparison determines that the load value for that phase of power is less than the respective threshold value for that phase of power.

19. The system of claim 18, further comprising a computing device, wherein opening the respective relay of the phase of power when the comparison determines that the load value for that phase of power is less than the respective threshold value for that phase of power comprises the respective relay receiving an open signal from the computing device over a network.

20. The system of claim 18 further comprising the processor configured to provide an alarm signal upon opening the respective relay of the phase of power when the comparison determines that the load value for that phase of power is less than the respective threshold value for that phase of power.

21. The system of claim 20, wherein the alarm signal is provided by the processor to an in-home device.

22. The system of claim 20, wherein the alarm signal is a text message or an email sent to a designated telephone number or email address.

23. The system of claim 17 further comprising the processor receiving a signal and in response to the signal closing one or more of the relays, wherein the one or more relays are each associated with respective phase of power of the poly-phase electrical system and were open prior to receiving the signal.

24. The system of claim 23, further comprising a thermostat, wherein the signal is received by the processor from the thermostat.

25. The system of claim 23, further comprising a computing device, wherein the signal is received by the processor from the computing device over a network.

26. The system of claim 25, wherein the network is an advanced metering infrastructure network.

27. The system of claim 23, wherein authorization must be received by the processor before closing one or more of the relays.

28. The system of claim 27, wherein the authorization is received as a password in a text message or email.

29. The system of claim 23 further comprising the processor providing an alarm signal before or upon closing one or more of the relays.

30. The system of claim 29, wherein the alarm signal is provided by the processor to an in-home device.

31. The system of claim 29, wherein the alarm signal is a text message or an email sent to a designated telephone number or email address.

32. The system of claim 23, further comprising updating the threshold value for one or more phases of power of the poly-phase electrical system based on one or more changes in the normal load value for each phase.

33. A meter comprised of:
- a memory, wherein a threshold value for each phase of power of a poly-phase electrical system is stored on the memory;
- a plurality of relays, wherein each one of the plurality of relays is configured to electrically open or close a respective phase of power of the poly-phase electrical system; and
- a processor, wherein the processor is operably connected with the memory and the plurality of relays, and wherein the processor is configured to:
  - determine a load value for each phase of power of a poly-phase electrical system;
  - compare the load value for each phase of power of a poly-phase electrical system with a respective threshold value for each phase of power of the poly-phase electrical system stored in the memory, wherein to determine each respective threshold value the processor is further configured to:
    - monitor a current for each phase over a period of time;
    - determine a normal load value for each phase based on monitoring a current for each phase over a predetermined period of time; and
    - set each respective threshold value to a percentage of the normal load value so that each respective threshold value is less than the normal load value;
  - open one or more of the plurality of relays based on the comparison when the comparison determines that the load value for that phase of power is less than the respective threshold value for that phase of power; and
  - provide an alarm signal upon opening the one or more of the plurality of relays when the comparison determines that the load value for that phase of power is less than the respective threshold value for that phase of power, wherein each one of the plurality of relays corresponds only to a single phase conductor configured to transmit only the respective phase of power along the single phase conductor, wherein each one of the plurality of relays is configured to terminate all transmission of the respective phase of power based on the comparison, and wherein a feedback signal indicating a position of each of the one or more relays is transmitted to one or more meters associated with the poly-phase electrical system.

* * * * *